United States Patent

Kengeri

[11] Patent Number: 6,141,236
[45] Date of Patent: Oct. 31, 2000

[54] INTERLEAVED STITCH USING SEGMENTED WORD LINES

[75] Inventor: Subramani Kengeri, Cupertino, Calif.

[73] Assignee: Alliance Semiconductor Corporation, Santa Clara, Calif.

[21] Appl. No.: 09/266,175

[22] Filed: Mar. 10, 1999

[51] Int. Cl.[7] ................................................. G11C 5/06
[52] U.S. Cl. ................................................. 365/63; 365/51
[58] Field of Search ........................................ 365/63, 51

[56] References Cited

U.S. PATENT DOCUMENTS

| | | | |
|---|---|---|---|
| 4,827,449 | 11/1998 | Inoue | 365/63 |
| 5,841,688 | 11/1998 | Sukegawa et al. | 365/63 |

Primary Examiner—Richard Elms
Assistant Examiner—Tuan T. Nguyen
Attorney, Agent, or Firm—Beyer Weaver & Thomas, LLP.

[57] ABSTRACT

A word line stitch mechanism to be used in high-density DRAMs is presented herein. The word line stitch mechanism of the present invention eliminates the problem caused by using the conventional word line stitch methods of the prior art in the high-density DRAMs. In the present invention, the word lines are segmented with an space between the two adjacent word line segments. Thereafter, the contacts between the word line segments and the associated metal layers are established such that the contact overlap areas are completely adjacent to all or a portion of the spaces between the word line segments of the adjacent word lines.

7 Claims, 3 Drawing Sheets

INTERLEAVED STITCH USING SEGMENTED WORD LINES

BACKGROUND OF THE INVENTION

1. Field of the Invention

The present invention relates generally to random access memories and more specifically, it relates to word line stitching in high-density dynamic random access memories.

2. Discussion of the Related Art

Today's highly advanced and sophisticated electronic systems increasingly require high-density and high-speed memories. The currently available technologies enable the development of high-density memories. While, the currently available process technologies provide the capability of designing and developing high-density memories, they also create stringent requirements that must be followed in design and layout of the devices.

Another factor that influences the design of the high-density memory devices is the cost of manufacturing. While, the market demands high-density memories, it also demands lower price for them. One way to reduce the cost is to design the high-density memory in the same die size used for a lower density memory. This means that memory cells are closer together and that the word lines and bit lines are manufactured much closer than before.

As the number of memory cells in a memory increases, so does the number of rows and columns of memory cells forming the array portion of the memory. An increase in the number of rows and columns while maintaining the total physical size of the array constant results in having the rows and columns, and thus the word lines and the bit lines, closer to each other.

One area in which the narrowing of the distance between the rows causes problem is in the area of word line stitching. Word line stitching is widely used in the design of memory devices. The word line is typically formed using poly layer, which has a substantially large equivalent resistance. To reduce the resistance of the word line, a metal layer is formed over the word line and is stitched to the word line in several intervals.

Referring now to FIG. 1, a typical word line stitching used in prior art is shown. It is noted that FIG. 1 is a fanciful depiction of how the word lines and metals are stitched together in the prior art. In addition, the dimensions shown in FIG. 1 are larger than the actual sizes for illustration purposes. FIG. 1 includes three word lines 10–14, three metal layers 16–20, and a plurality of contacts 22, contacts 24, and contacts 26. Typically, the word lines are fabricated from poly layers with metal layers being fabricated on the top of the word lines and are in parallel with them. Metal layer 16 is associated with word line 10, metal layer 18 is associated with word line 12, and metal layer 20 is associated with word line 14. Contacts 22 are used to stitch metal layer 16 to word line 10, contacts 24 are used to stitch metal layer 18 to word line 12, and contacts 26 are used to stitch metal 20 to word line 14.

Each contact 22 is associated with a poly contact overlap area 28 and a metal overlap area 30. Similarly, each contact 24 is associated with a poly contact overlap area 32 and a metal overlap area 34 and each contact 26 is associated with a poly contact overlap area 36 and a metal overlap area 38. Both the poly and metal contact overlaps are provided to assure a proper contact between the metal layers and the corresponding word line. As it can further be seen in FIG. 1, the contacts, including their respective overlap sections, are fabricated such that they aligned in a column.

It is very important from processing point of view that a minimum distance between the contacts as represented by "A" be maintained. Otherwise, the contact overlap areas could merge and short one word line to the adjacent word line. Furthermore, it is very important that the distance represented by B be less than or equal to one cell pitch. The cell pitch is defined as the total size of the memory cell. In the high-density memory devices having a much more compact architecture, it is very hard to maintain the minimum required distances using the word line stitch architecture of FIG. 1.

An alternative approach would be to eliminate the word line stitches and replace them with row decoders fabricated in place of the contacts. This would both increase the complexity of the memory device and increase the die size. An increase in the die size directly affects the cost of the device.

Accordingly, an alternative approach to incorporating the word line stitches, while adhering to the stringent physical restriction of the high-density memory devices is needed.

SUMMARY AND OBJECTIVES OF THE INVENTION

It is the object of the present invention to provide a word line stitch mechanism to be used in high-density DRAMs.

It is a further object of the present invention to provide a word line stitch mechanism to be used in high-density DRAMs whereby the problems caused by the use of conventional stitch mechanism are eliminated.

The DRAMs incorporating the word line stitch mechanism of the present invention include word lines that are segmented. Each word line is comprised of a plurality of word line segments. There is a space between the adjacent word line segments of each word line. Each word line is associated with a metal layer that is formed over and in parallel with the word line. Each word line segment is stitched to the associated metal layer through a contact, which is by a contact overlap area. The word line segments of the alternate word lines are strapped to the associated metal layer on the opposite end. The contacts and their surrounding overlap area are positioned such that they completely align with a portion or the entire space between the adjacent word line segments of the adjacent word lines.

DETAILED DESCRIPTION OF THE EMBODIMENTS

The present invention now will be described more fully with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
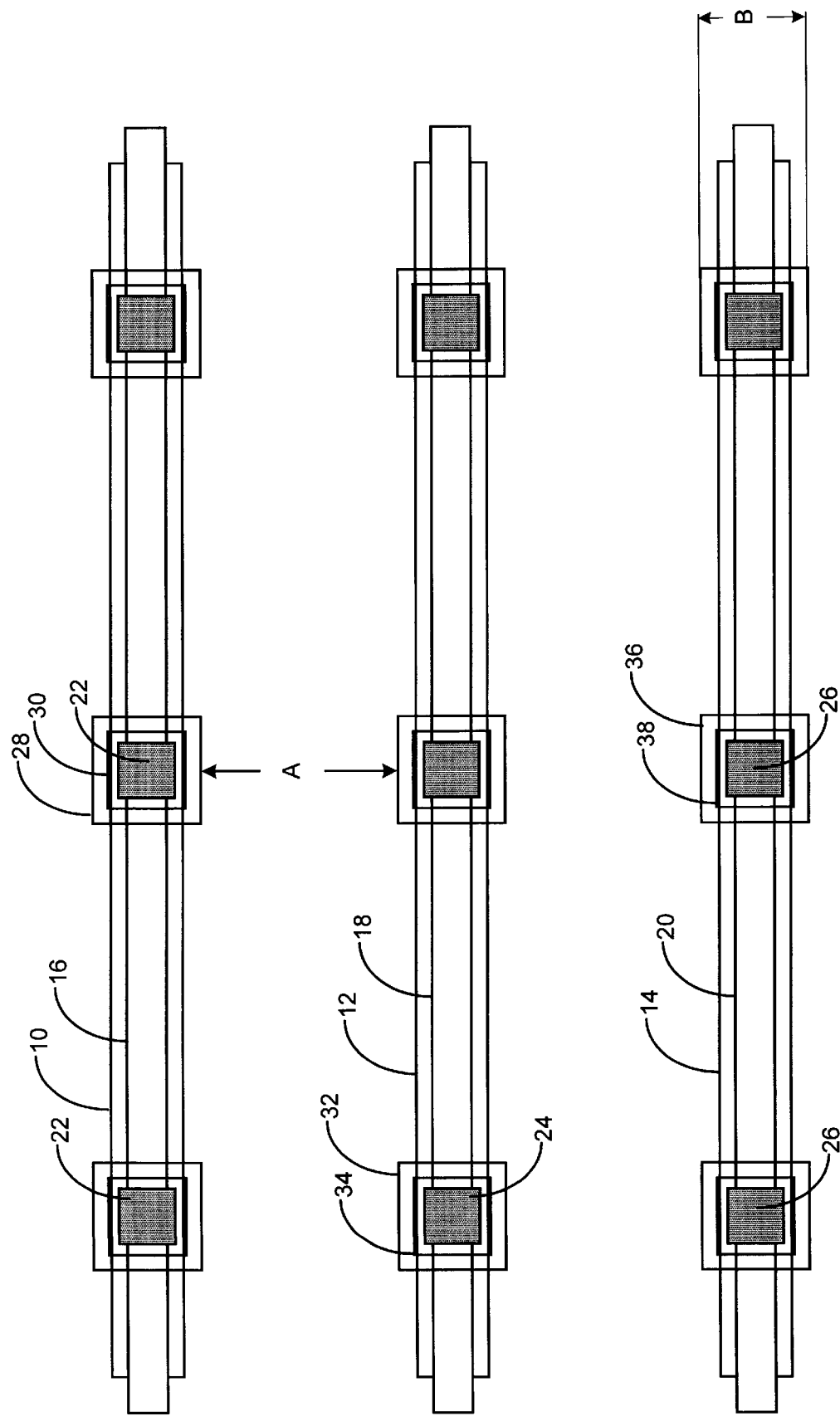
FIG. 1 depicts the prior art method of stitching a metal layer to a word line.
Figure 2:
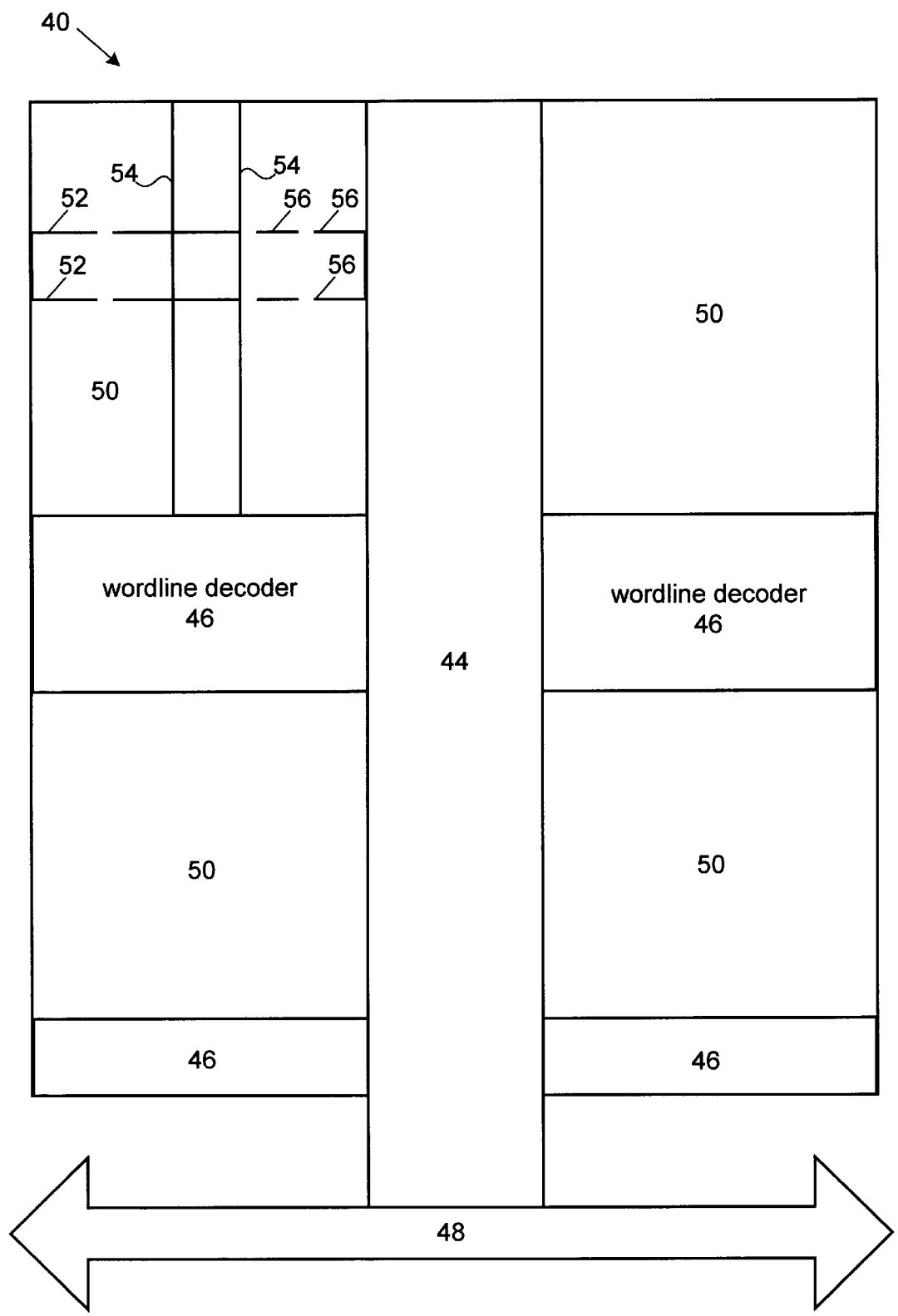
FIG. 2 is a block diagram of a memory device incorporating the present invention.

Referring now to FIG. 2, a block diagram of a memory device incorporating the present invention is shown. The memory 40 includes an array of memory cells 42, column and I/O decoders 44, word line decoders 46, and I/O bus 48. Array 42 is partitioned into four sectors 50, with each sector being associated with one row decoder section 46. Each sector includes a plurality of rows 52 and columns 54. There is one memory cell at the intersection of a row and a column. As it can be seen in FIG. 2, each row 52 is comprised of a plurality of row segments 56.

Figure 3:
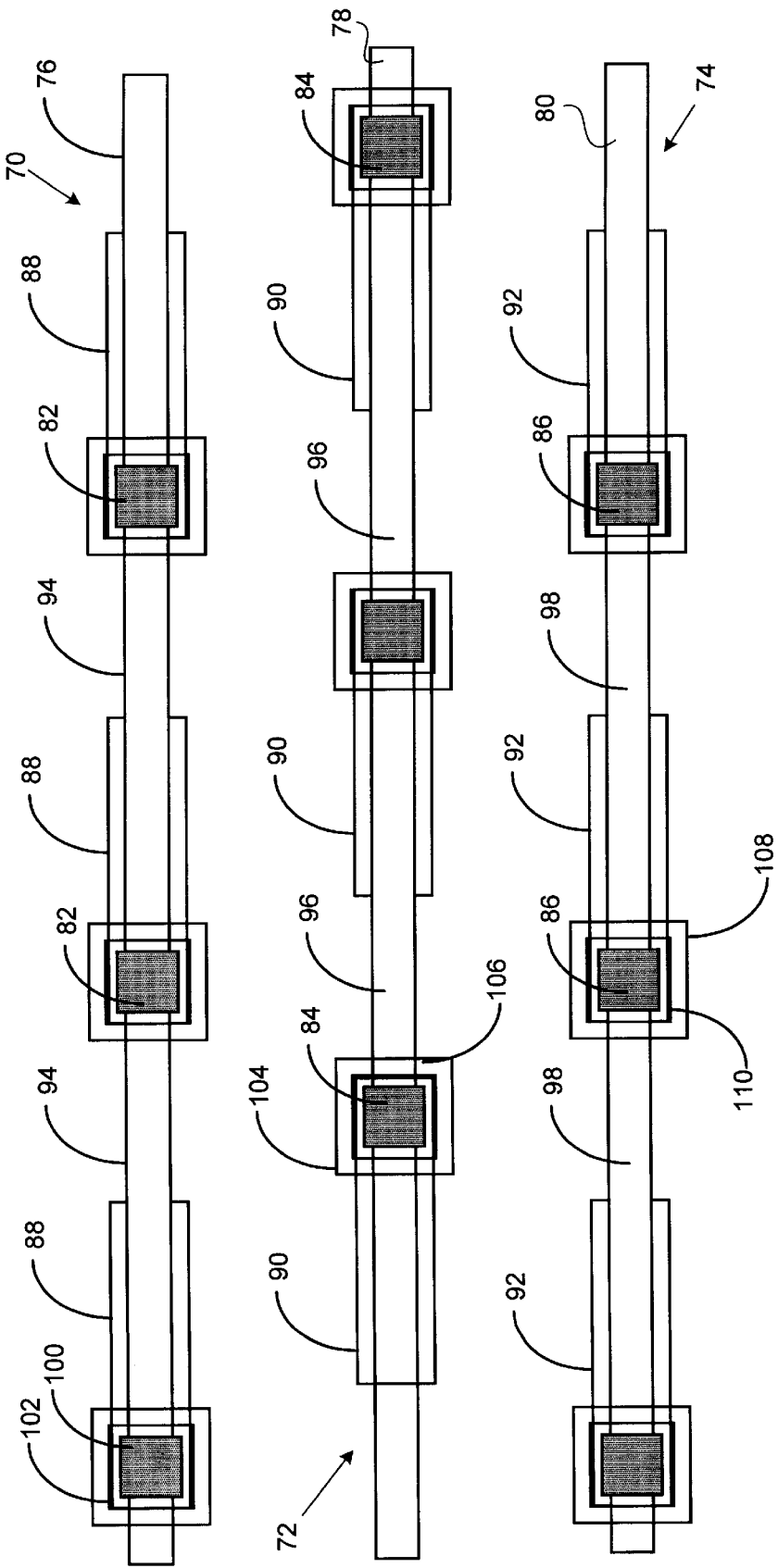
FIG. 3 is a fanciful depiction of three exemplary word lines of the present invention and each word line is stitched to its respective metal layer.

Referring now to FIG. 3, the word line stitch scheme according to the present invention is presented fancifully. It is noted that the dimensions shown ill FIG. 3 are much larger than the actual size and distances. It also is noted that what is shown in FIG. 3 is exemplary and that in the actual memory device using the present invention, more than three word lines exist. Furthermore, each word line in the actual memory device would include more than three word line segments.

FIG. 3 includes three word lines 70–74, three metal layers 76–80, and contacts 82–86. Word line 70 includes a plurality of word line segments 88, three of which are shown here. Similarly, word line 72 includes a plurality of word line segments 90, three of which are shown here, and word line 74 includes a plurality of word line segments 92, three of which are shown here. There is a space 94 between each word line segment 88, a space 96 between each word line segments 90, and a space 98 between each word line segment 92. Metal layer 76 is formed over and in parallel with word line 70 and is stitched to word line segments 88 via contacts 82. Similarly, metal layer 78 is formed over and in parallel with word line 72 and is stitched to word line segments 90 via contacts 84 and Metal layer 80 is formed over and in parallel with word line 74 and is stitched to word line segments 92 via contacts 86. Each contact 82 is surrounded by poly overlap 100 and a metal overlap 102. Similarly, each contact 84 is surrounded by poly overlap 104 and metal overlap 106 and each contact 86 is surrounded by poly overlap 108 and metal overlap 110.

Each word line segment 88–92 is formed such that each extends into the space between two adjacent word line segments in the adjacent word lines. The extension is sufficiently long to ensure that the metal to poly contact and its surrounding overlap areas are aligned entirely with all or a portion of the adjacent spaces. Additionally, the word line segments of the alternate word lines are strapped to the respective metal layers on opposite ends.

Referring to FIG. 3, the word line segments 88 and 92 are strapped to metal layers 76 and 80, respectively, on their left ends, whereas, the word line segments 90 are strapped to the metal layer 78 on their right ends. This scheme will ensure that there is sufficient space to fabricate the metal to poly contacts, along with the overlap areas, while substantially eliminating the possibility of overlap areas merging, thereby, causing two word lines to short together. The scheme of the present invention effectively provides twice as area as the prior for each contact and the surrounding overlap areas. Thus, effectively, the present invention increases the cell pitch by a factor of two.

The word line stitch approach of the present invention enables the design and development of high density DRAM devices while eliminating the problem of caused by packing the word lines closer and closer to each other to develop high density DRAM memories.

In the drawings and specification, the preferred embodiments of the present invention have been disclosed. Although specific terms are employed, they are used in a generic and descriptive sense only and not for purposes of limitation, the scope of the present invention is set forth in the following claims.

What is claimed is:

1. A memory device having memory cells arranged in a row of memory cells, comprising:
   a first word line formed of,
   a first plurality of word line segments each being fabricated with a first space therebetween, and
   a first metal layer formed over the first plurality of word line segments; a second word line, parallel and distinct from the first word line, formed of,
   a second plurality of word line segments each being fabricated with a second space therebetween,
   a second metal layer formed over the second plurality of word line segments, wherein each of the first plurality of word line segments and each of the second plurality of word line segments are laterally staggered in relation to each other such that a first end portion of each of the first plurality of word line segments is in proximate juxtaposition to an adjacent one of the second spaces of the second word line and such that a first end portion of each of the second plurality of word line segments is in proximate juxtaposition to an adjacent one of the first spaces of the first word line;
   a first plurality of contacts connecting the first metal layer with the first end portion of each of the first plurality of word line segments; and
   a second plurality of contacts connecting the second metal layer with the first end portion of each of the second plurality of word line segments such that a pitch between the first word line and the second word line is substantially reduced.

2. The memory device as recited in claim 1 further comprising a contact overlap area respectively surrounding each of said first plurality of contacts and each of said second plurality of contacts, wherein each of said contacts and its respective overlap area connecting the first word line to the associated first metal layer are positioned such that most of said first plurality of contacts align with an associated adjacent one of the second spaces of the second word line.

3. The memory device as recited in claim 1, wherein the memory device is a dynamic random access memory device.

4. The memory device as recited in claim 1, wherein the memory device is a static random access memory device.

5. In a memory device having memory cells arranged in rows and columns, a method of providing word line stitches, comprising:
   forming a first word line by,
   fabricating a first plurality of word line segments each having a first space therebetween, and
   depositing a first metal layer over the first plurality of word line segments;
   forming a second word line parallel and distinct from the first word line by,
   fabricating a second plurality of word line segments each having a second space therebetween, wherein each of the first plurality of word line segments and each of the second plurality of word line segments are laterally staggered in relation to each other such that a first end portion of each of the first plurality of word line segments is in proximate juxtaposition to an adjacent one of the second spaces of the second word line, and such that a first end portion of each of the second plurality of word line segments is in proximate juxtaposition to an adjacent one of the first spaces of the first word line, and depositing a second metal layer over the second plurality of word line segments;

using a first plurality of contacts to connect the first metal layer to the first end portion of each of the first plurality of word line segments; and using a second plurality of contacts to connect the second metal layer to the first end portion of each of the second plurality of word line segments such that a pitch between the first word line and the second word line is substantially reduced.

6. The method of providing word line stitches as recited in claim 5, wherein the memory device is a dynamic random access memory device.

7. The method of providing word line stitches as recited in claim 5, wherein the memory device is a static random access memory device.

* * * * *